(12) United States Patent
He et al.

(10) Patent No.: US 12,225,759 B2
(45) Date of Patent: Feb. 11, 2025

(54) DISPLAY SUBSTRATE AND METHOD FOR MANUFACTURING THE SAME, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yupeng He, Beijing (CN); Yang Zhou, Beijing (CN); Xin Zhang, Beijing (CN); Pengfei Yu, Beijing (CN); Xiaofeng Jiang, Beijing (CN); Yi Qu, Beijing (CN); Lulu Yang, Beijing (CN); Huijun Li, Beijing (CN); Meng Zhang, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 18/510,068

(22) Filed: Nov. 15, 2023

(65) Prior Publication Data
US 2024/0099053 A1 Mar. 21, 2024

Related U.S. Application Data

(63) Continuation of application No. 17/280,061, filed as application No. PCT/CN2020/090550 on May 15, 2020, now Pat. No. 11,864,413.

(51) Int. Cl.
*H10K 50/844* (2023.01)
*H10K 59/12* (2023.01)
(Continued)

(52) U.S. Cl.
CPC ....... *H10K 50/844* (2023.02); *H10K 59/1213* (2023.02); *H10K 59/1216* (2023.02);
(Continued)

(58) Field of Classification Search
CPC ............. H10K 50/844; H10K 59/1201; H10K 59/1213; H10K 59/1216; H10K 59/122;
(Continued)

(56) References Cited

U.S. PATENT DOCUMENTS

2014/0117385 A1* 5/2014 Park .................. H01L 33/387
438/34
2016/0118631 A1* 4/2016 Kim ..................... H10K 50/11
438/34
(Continued)

FOREIGN PATENT DOCUMENTS

CN 109920818 A 6/2019
CN 110212113 A 9/2019
(Continued)

OTHER PUBLICATIONS

International Search Report and Written Opinion of PCT/CN2020/090550 dated Feb. 18, 2021, and English translation, 14 pages.
(Continued)

*Primary Examiner* — Omar F Mojaddedi
(74) *Attorney, Agent, or Firm* — Muncy, Geissler, Olds & Lowe, P.C.

(57) ABSTRACT

A display substrate, a manufacturing method thereof, and a display device are provided. A pixel region is provided with a light emission function layer on a base substrate of the display substrate, and a separation region is provided with at least one first barrier structure. The first barrier structure includes a stopper pattern and a first separation component. A side surface of the first separation component has a recess, and a portion of the light emission function layer extending
(Continued)

to the separation region is disconnected on the side of the first separation component. The separation region is provided with an inorganic layer structure on the base substrate. The inorganic layer structure includes multiple stacked inorganic film layers, the stopper pattern is located between two adjacent inorganic film layers and the first separation component is located on a side of the inorganic layer structure away from the base substrate.

20 Claims, 6 Drawing Sheets

(51) Int. Cl.
　　*H10K 59/121*　　(2023.01)
　　*H10K 59/122*　　(2023.01)
　　*H10K 59/124*　　(2023.01)
　　*H10K 59/65*　　(2023.01)
　　*H10K 71/00*　　(2023.01)

(52) U.S. Cl.
　　CPC ......... *H10K 59/122* (2023.02); *H10K 59/124* (2023.02); *H10K 59/65* (2023.02); *H10K 71/00* (2023.02); *H10K 59/1201* (2023.02)

(58) Field of Classification Search
　　CPC .. H10K 59/124; H10K 59/65; H10K 59/8731; H10K 71/00
　　See application file for complete search history.

(56) References Cited

U.S. PATENT DOCUMENTS

| | | | |
|---|---|---|---|
| 2016/0284774 A1* | 9/2016 | Zhang | H10K 77/111 |
| 2016/0322437 A1* | 11/2016 | Sakamoto | H10K 59/122 |
| 2017/0236839 A1* | 8/2017 | Yamazaki | H01L 21/76834 |
| | | | 257/43 |
| 2019/0006443 A1* | 1/2019 | Hanashima | H10K 59/122 |
| 2019/0035865 A1* | 1/2019 | Cui | H10K 50/81 |
| 2019/0189596 A1* | 6/2019 | Chae | H01L 33/08 |
| 2020/0127233 A1 | 4/2020 | Sung et al. | |
| 2020/0176520 A1* | 6/2020 | Kim | H10K 50/844 |
| 2020/0235180 A1* | 7/2020 | Park | H10K 59/87 |
| 2020/0273926 A1* | 8/2020 | Lee | H10K 71/00 |
| 2021/0005641 A1 | 1/2021 | Xie et al. | |
| 2021/0028249 A1 | 1/2021 | Ding et al. | |
| 2021/0273194 A1 | 9/2021 | Xie et al. | |
| 2021/0376293 A1 | 12/2021 | Zhao et al. | |
| 2022/0376207 A1 | 11/2022 | Ban et al. | |

FOREIGN PATENT DOCUMENTS

| | | |
|---|---|---|
| CN | 110265471 A | 9/2019 |
| CN | 110265583 A | 9/2019 |
| CN | 110518141 A | 11/2019 |
| CN | 110828519 A | 2/2020 |
| CN | 110875440 A | 3/2020 |
| JP | 2016085796 A | 5/2016 |

OTHER PUBLICATIONS

Notice of Allowance of U.S. Appl. No. 17/280,061 dated Aug. 31, 2023, 29 pages.

\* cited by examiner

DISPLAY SUBSTRATE AND METHOD FOR MANUFACTURING THE SAME, DISPLAY DEVICE

CROSS-REFERENCE TO RELATED APPLICATION

The present application claims the benefit of and is a continuation application of U.S. patent application Ser. No. 17/280,061 filed on Mar. 25, 2021, which is the U.S. national phase of PCT Application No. PCT/CN2020/090550 filed on May 15, 2020, the disclosure of which is incorporated in its entirety by reference herein.

TECHNICAL FIELD

The present disclosure relates to the field of display technology, in particular to a display substrate, a method for manufacturing the display substrate, and a display device.

BACKGROUND

With the development of display technology, increasing the screen-to-body ratio of a display screen has been an issue drawing increasing attention. At present, to achieve a higher screen-to-body ratio, some hole regions (e.g., holes) are reserved on the display screen for some additional components (e.g., camera, sensor and the like). However, in the vicinity of the hole region in the screen, moisture and oxygen may penetrate from the cutting line at the hole boundary into the interior of the display screen via the light emission function layer of the display screen and erode the interior of the display screen, leading to a display failure; moreover, during the cutting for forming the hole, a crack resulting from the cutting may propagate to the interior of the display screen, thereby impacting the yield of display screens.

SUMMARY

An objective of the present disclosure is to provide a display substrate, a method for manufacturing the display substrate, and a display device.

In a first aspect of the present disclosure, a display substrate is provided. The display substrate has a display region, wherein the display region includes a pixel region, a hole region and a separation region located between the pixel region and the hole region and surrounding the hole region;
  the pixel region includes a light emission function layer on a base substrate of the display substrate, and a driver circuit layer between the base substrate and the light emission function layer, wherein the driver circuit layer includes a conductive layer;
  the separation region is provided with at least one first barrier structure on the base substrate, wherein the first barrier structure includes: a stopper pattern and a first separation component sequentially stacked in a direction away from the base substrate, the stopper pattern and the conductive layer are made on the same layer, a side surface of the first separation component has a recess, and a portion of the light emission function layer that extends to the separation region is disconnected on the side of the first separation component;
  the separation region is further provided with an inorganic layer structure on the base substrate, wherein the inorganic layer structure includes multiple stacked inorganic film layers, the stopper pattern is located between two adjacent inorganic film layers and the first separation component is located on a side of the inorganic layer structure facing away from the base substrate.

Optionally, the stopper pattern includes a first stopper pattern and a second stopper pattern;
  the inorganic layer structure includes a first inorganic layer, a second inorganic layer and a third inorganic layer sequentially stacked in the direction away from the base substrate, the first stopper pattern is located between the first inorganic layer and the second inorganic layer, and the second stopper pattern is located between the second inorganic layer and the third inorganic layer.

Optionally, the driver circuit layer includes a transistor structure and a capacitor structure, the transistor structure includes an active layer, a gate electrode and a source-drain electrode layer sequentially stacked in the direction away from the base substrate, the source-drain electrode layer includes a source electrode and a drain electrode arranged in a same layer and made of a same material, the capacitor structure includes a first electrode plate and a second electrode plate arranged oppositely in a direction perpendicular to the base substrate, the first electrode plate and the gate electrode are arranged in a same layer and made of a same material, the second electrode plate is located between the first electrode plate and the source-drain electrode layer;
  the first inorganic layer extends between the active layer and the gate electrode to act as a first gate insulation layer, the second inorganic layer extends between the gate electrode and the second electrode plate to act as a second gate insulation layer, and the third inorganic layer extends between the second electrode plate and the source-drain electrode layer to act as an interlayer dielectric layer;
  the conductive layer includes the gate electrode and the second electrode plate, the first stopper pattern and the gate electrode are arranged in a same layer and made of a same material, and the second stopper pattern and the second electrode plate are arranged in a same layer and made of a same material.

Optionally, the separation region is further provided with at least one second separation component on the base substrate, and an orthographic projection of the second separation component onto the base substrate is located on a side of an orthographic projection of the first barrier structure onto the base substrate which is away from the hole region;
  a side surface of the second separation component has a recess, and a portion of the light emission function layer extending to the separation region is disconnected on the side of the second separation component.

Optionally, the separation region is provided with multiple spaced-apart second separation components;
  the inorganic layer structure extends between the multiple second separation components and the base substrate, the inorganic layer structure has a groove, and an orthographic projection of the groove onto the base substrate is located between orthographic projections of the adjacent second separation components onto the base substrate.

Optionally, the inorganic layer structure includes a first gate insulation layer, a second gate insulation layer and an interlayer dielectric layer sequentially stacked in the direction away from the base substrate, and the groove passes through the first gate insulation layer, the second gate insulation layer and the interlayer dielectric layer in a direction perpendicular to the base substrate.

Optionally, a depth of the groove in the direction perpendicular to the base substrate ranges from 6000 Å to 8000 Å.

Optionally, the first separation component includes a first function pattern, a second function pattern and a third function pattern sequentially stacked in the direction away from the base substrate, an orthographic projection of the first function pattern onto the base substrate surrounds an orthographic projection of the second function pattern onto the base substrate, an orthographic projection of the third function pattern onto the base substrate surrounds the orthographic projection of the second function pattern onto the base substrate; and/or, the second separation component includes a fourth function pattern, a fifth function pattern and a sixth function pattern sequentially stacked in the direction away from the base substrate, an orthographic projection of the fourth function pattern onto the base substrate surrounds an orthographic projection of the fifth function pattern onto the base substrate, an orthographic projection of the sixth function pattern onto the base substrate surrounds the orthographic projection of the fifth function pattern onto the base substrate.

Optionally, the pixel region is further provided with a transistor structure between the base substrate and the light emission function layer, the transistor structure includes an active layer, a gate electrode and a source-drain electrode layer sequentially stacked in the direction away from the base substrate, the source-drain electrode layer includes a source electrode and a drain electrode arranged in a same layer and made of a same material, and both the source electrode and the drain electrode include a first metal sub-film layer, a second metal sub-film layer and a third metal sub-film layer sequentially stacked in the direction away from the base substrate;

the first function pattern and the first metal sub-film layer are arranged in a same layer and made of a same material, the second function pattern and the second metal sub-film layer are arranged in a same layer and made of a same material, the third function pattern and the third metal sub-film layer are arranged in a same layer and made of a same material; and/or, the fourth function pattern and the first metal sub-film layer are arranged in a same layer and made of a same material, the fifth function pattern and the second metal sub-film layer are arranged in a same layer and made of a same material, the sixth function pattern and the third metal sub-film layer are arranged in a same layer and made of a same material.

Optionally, the display substrate further includes a first source-drain metal layer and a second source-drain metal layer sequentially stacked on the base substrate in the direction away from the base substrate, the second source-drain metal layer includes a fourth metal sub-film layer, a fifth metal sub-film layer and a sixth metal sub-film layer sequentially stacked in the direction away from the base substrate;

the first function pattern and the fourth metal sub-film layer are arranged in a same layer and made of a same material, the second function pattern and the fifth metal sub-film layer are arranged in a same layer and made of a same material, the third function pattern and the sixth metal sub-film layer are arranged in a same layer and made of a same material; and/or, the fourth function pattern and the fourth metal sub-film layer are arranged in a same layer and made of a same material, the fifth function pattern and the fifth metal sub-film layer are arranged in a same layer and made of a same material, the sixth function pattern and the sixth metal sub-film layer are arranged in a same layer and made of a same material.

Optionally, the separation region is further provided with:

a dam structure on the base substrate, an orthographic projection of the dam structure onto the base substrate being between the orthographic projection of the first barrier structure onto the base substrate and the orthographic projection of the second separation component onto the base substrate;

an encapsulation structure extending from the pixel region to the separation region, wherein the encapsulation structure includes a first inorganic encapsulation layer, an organic encapsulation layer and a second inorganic encapsulation layer sequentially stacked in the direction away from the base substrate;

the first inorganic encapsulation layer and the second inorganic encapsulation layer completely cover the first barrier structure, the second separation component and the dam structure;

an orthographic projection of the organic encapsulation layer onto the base substrate is located on a side of the orthographic projection of the dam structure onto the base substrate which is away from the hole region.

Optionally, the dam structure includes a first dam component and a second dam component sequentially arranged in a direction towards the hole region, a height of a surface of the first dam component facing away from the base substrate is lower than a height of a surface of the second dam component facing away from the base substrate.

Optionally, the pixel region is further provided with a pixel definition layer and a spacer layer sequentially stacked on the base substrate in the direction away from the base substrate;

the first dam component includes a first dam pattern and a second dam pattern sequentially stacked in the direction away from the base substrate, the first dam pattern and the pixel definition layer are arranged in a same layer and made of a same material, and the second dam pattern and the spacer layer are arranged in a same layer and made of a same material.

Optionally, the pixel region is further provided with a planarization layer, a pixel definition layer and a spacer layer sequentially stacked on the base substrate in the direction away from the base substrate;

the second dam component includes a third dam pattern, a fourth dam pattern and a fifth dam pattern sequentially stacked in the direction away from the base substrate, the third dam pattern and the planarization layer are arranged in a same layer and made of a same material, the fourth dam pattern and the pixel definition layer are arranged in a same layer and made of a same material, and the fifth dam pattern and the spacer layer are arranged in a same layer and made of a same material.

Optionally, the pixel region is further provided with a first planarization layer, a second planarization layer, and a pixel definition layer sequentially stacked on the base substrate in the direction away from the base substrate;

the first dam component includes a first dam pattern and a second dam pattern sequentially stacked in the direction away from the base substrate, the first dam pattern and the first planarization layer are arranged in a same layer and made of a same material, and the second dam pattern and the pixel definition layer are arranged in a same layer and made of a same material.

Optionally, the pixel region is further provided with a first planarization layer, a second planarization layer, and a pixel definition layer sequentially stacked on the base substrate in the direction away from the base substrate;

the second dam component includes a third dam pattern, a fourth dam pattern and a fifth dam pattern sequentially stacked in the direction away from the base substrate, the third dam pattern and the first planarization layer are arranged in a same layer and made of a same material, the fourth dam pattern and the second planarization layer are arranged in a same layer and made of a same material, and the fifth dam pattern and the pixel definition layer are arranged in a same layer and made of a same material.

Based on the foregoing technical solution of display substrate, a second aspect of the present disclosure provides a display device including the foregoing display substrate.

Based on the foregoing technical solution of display substrate, a third aspect of the present disclosure provides a method for manufacturing a display substrate, the display substrate having a display region, the display region including a pixel region, a hole region and a separation region located between the pixel region and the hole region and surrounding the hole region, wherein the method includes:

manufacturing a driver circuit layer on a base substrate in the pixel region, wherein the driver circuit layer includes a conductive layer;

manufacturing an inorganic layer structure and at least one first barrier structure on the base substrate in the separation region; wherein the first barrier structure includes: a stopper pattern and a first separation component sequentially stacked in a direction away from the base substrate, the stopper pattern and the conductive layer are made on the same layer, a side surface of the first separation component has a recess, the inorganic layer structure includes multiple stacked inorganic film layers, the stopper pattern is located between two adjacent inorganic film layers and the first separation component is located on a side of the inorganic layer structure facing away from the base substrate;

forming a light emission function layer in the pixel region and the separation region on the base substrate formed with the driver circuit layer, the inorganic layer structure and the at least one first barrier structure, wherein a portion of the light emission function layer in the separation region is disconnected on the side of the first separation component.

Optionally, the stopper pattern includes a first stopper pattern and a second stopper pattern; the inorganic layer structure includes a first inorganic layer, a second inorganic layer and a third inorganic layer sequentially stacked in the direction away from the base substrate, the first stopper pattern is located between the first inorganic layer and the second inorganic layer, and the second stopper pattern is located between the second inorganic layer and the third inorganic layer; the driver circuit layer includes a transistor structure and a capacitor structure, the transistor structure includes an active layer, a gate electrode and a source-drain electrode layer sequentially stacked in the direction away from the base substrate, the source-drain electrode layer includes a source electrode and a drain electrode arranged in a same layer and made of a same material, the capacitor structure includes a first electrode plate and a second electrode plate arranged oppositely in a direction perpendicular to the base substrate, the first electrode plate and the gate electrode are arranged in a same layer and made of a same material, the second electrode plate is located between the first electrode plate and the source-drain electrode layer; the first inorganic layer extends between the active layer and the gate electrode to act as a first gate insulation layer, the second inorganic layer extends between the gate electrode and the second electrode plate to act as a second gate insulation layer, and the third inorganic layer extends between the second electrode plate and the source-drain electrode layer to act as an interlayer dielectric layer;

a step of manufacturing the stopper pattern specifically includes:

forming the first stopper pattern and the gate electrode simultaneously in a single patterning process;

forming the second stopper pattern and the second electrode plate simultaneously in a single patterning process.

Optionally, the method further includes:

manufacturing at least one second separation component on the base substrate in the separation region, wherein an orthographic projection of the second separation component onto the base substrate is located on a side of an orthographic projection of the first barrier structure onto the base substrate which is away from the hole region; a side surface of the second separation component has a recess, and a portion of the light emission function layer extending to the separation region is disconnected on the side of the second separation component.

Optionally, the pixel region is further provided with a transistor structure between the base substrate and the light emission function layer, the transistor structure includes an active layer, a gate electrode and a source-drain electrode layer sequentially stacked in the direction away from the base substrate, the source-drain electrode layer includes a source electrode and a drain electrode arranged in a same layer and made of a same material;

a step of manufacturing the first separation component and the second separation component specifically includes:

forming the first separation component, the second separation component, the source electrode and the drain electrode simultaneously in a single patterning process.

Optionally, the display substrate further includes a first source-drain metal layer and a second source-drain metal layer sequentially stacked on the base substrate in the direction away from the base substrate;

a step of manufacturing the first separation component and the second separation component specifically includes:

forming the first separation component, the second separation component and the second source-drain metal layer simultaneously in a single patterning process.

BRIEF DESCRIPTION OF THE DRAWINGS

The accompanying drawings described here are used to provide further understanding of present disclosure and constitute a part of the present disclosure. The exemplary embodiments of the present disclosure and the description thereof serve to explain the present disclosure, and do not constitute an undue limitation on the present disclosure.

DETAILED DESCRIPTION

Figure 1:
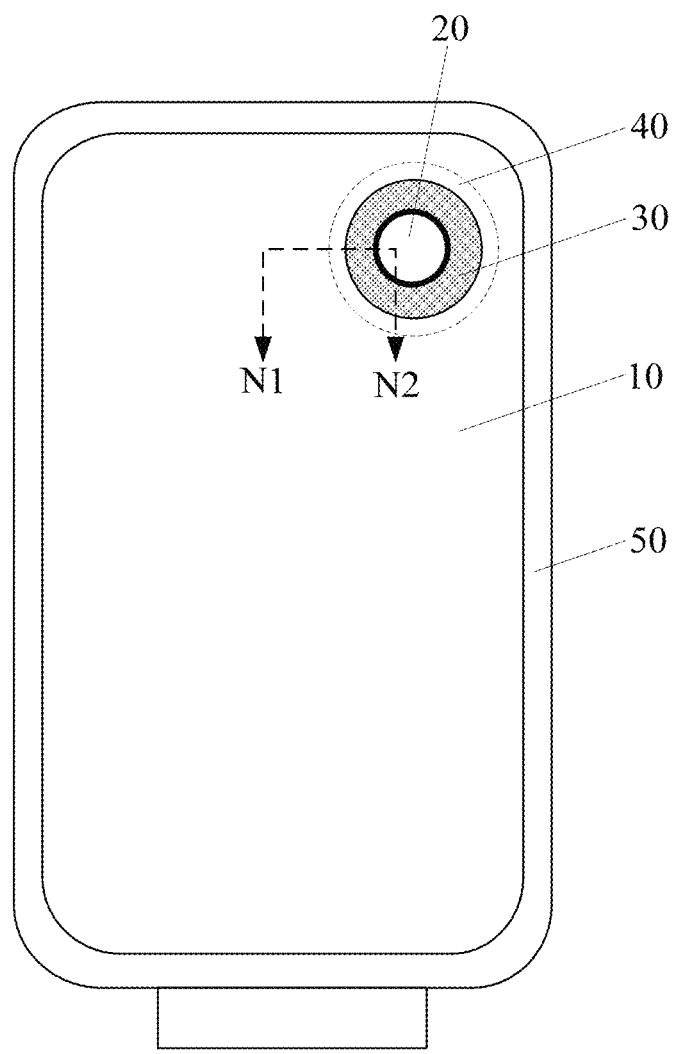
FIG. 1 is a schematic structural diagram of a display substrate according to an embodiment of the present disclosure.

To further describe the display substrate, the method for manufacturing the display substrate, and the display device according to embodiments of the present disclosure, a detailed description is given below with reference to the accompanying drawings of the specification.

When a hole is formed on a display screen, the hole is generally located within the display region, that is, the hole is surrounded by the display region. Thus, the light emission function layer in the display screen extends to the perimeter of the cutting line at the hole boundary. As a result, moisture and oxygen may penetrate from the cutting line at the hole boundary into the interior of the display screen via the light emission function layer of the display screen and erode the interior of the display screen, leading to a display failure; moreover, during the cutting for forming the hole, a crack resulting from the cutting may propagate to the interior of the display screen, thereby impacting the yield of display screens.

In view of the above problems, referring to FIG. 1 to FIG. 4, an embodiment of the present disclosure provides a display substrate. The display substrate has a display region, wherein the display region includes a pixel region 10, a hole region 20 and a separation region 30 located between the pixel region 10 and the hole region 20 and surrounding the hole region 20;

the pixel region 10 includes a light emission function layer 61 on a base substrate 60 of the display substrate, and a driver circuit layer between the base substrate 60 and the light emission function layer 61, wherein the driver circuit layer includes a conductive layer;

the separation region 30 is provided with at least one first barrier structure 31 on the base substrate 60, wherein the first barrier structure 31 includes: a stopper pattern 310 and a first separation component 311 sequentially stacked in a direction away from the base substrate 60, the stopper pattern and the conductive layer are made on the same layer, a side surface of the first separation component 311 has a recess, and a portion of the light emission function layer 61 that extends to the separation region 30 is disconnected on the side of the first separation component 311;

the separation region 30 is further provided with an inorganic layer structure on the base substrate 60, wherein the inorganic layer structure includes multiple stacked inorganic film layers, the stopper pattern is located between two adjacent inorganic film layers and the first separation component is located on a side of the inorganic layer structure facing away from the base substrate.

Figure 2:
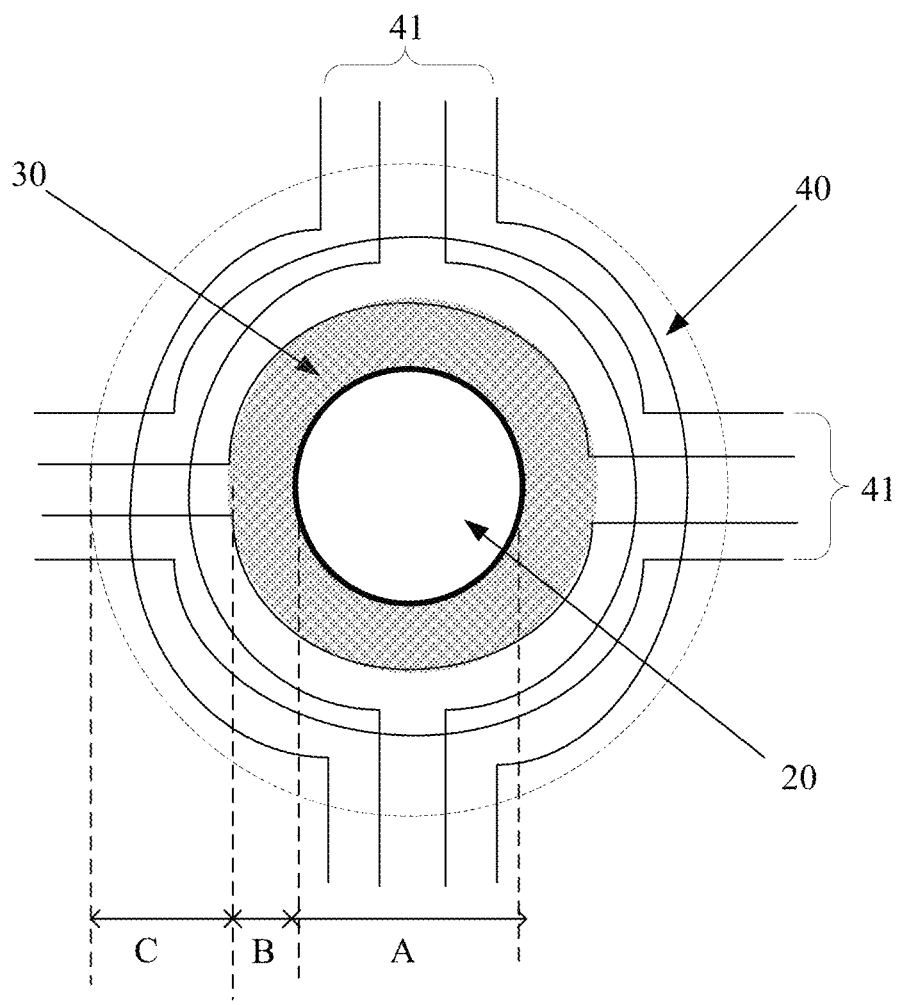
FIG. 2 is a schematic diagram of the vicinity of a hole region according to an embodiment of the present disclosure.

Specifically, as shown in FIG. 1, the display substrate has a display region and a peripheral region 50 surrounding the display region. The display region includes a pixel region 10, a hole region 20, and a separation region 30 located between the pixel region 10 and the hole region 20. The separation region 30 surrounds the hole region 20, and the pixel region 10 surrounds the separation region 30. A portion of the pixel region 10 close to the separation region 30 is provided with a peripheral wiring region 40. As shown in FIG. 2, the peripheral wiring region 40 is provided with multiple peripheral wirings 41. In FIG. 2, A represents a corresponding aperture of the circular hole region 20, B represents a width of the separation region 30, and C represents a width of the peripheral wiring region.

A specific location of the hole region 20 may be set according to actual needs. For example, the display substrate includes a rectangular display region, and the hole region 20 is locate at the top-left corner or top-right corner of the rectangular display region. For example, the hole region 20 is of a regular shape, such as circular or rectangular shape.

The base substrate 60 of the display substrate includes a flexible base substrate, for example, a flexible polyimide (PI) base substrate 60. When the hole region 20 is being formed, the base substrate 60 in the hole region 20 and the film layers on the base substrate 60 in the hole region 20 may be removed together.

Figure 3:
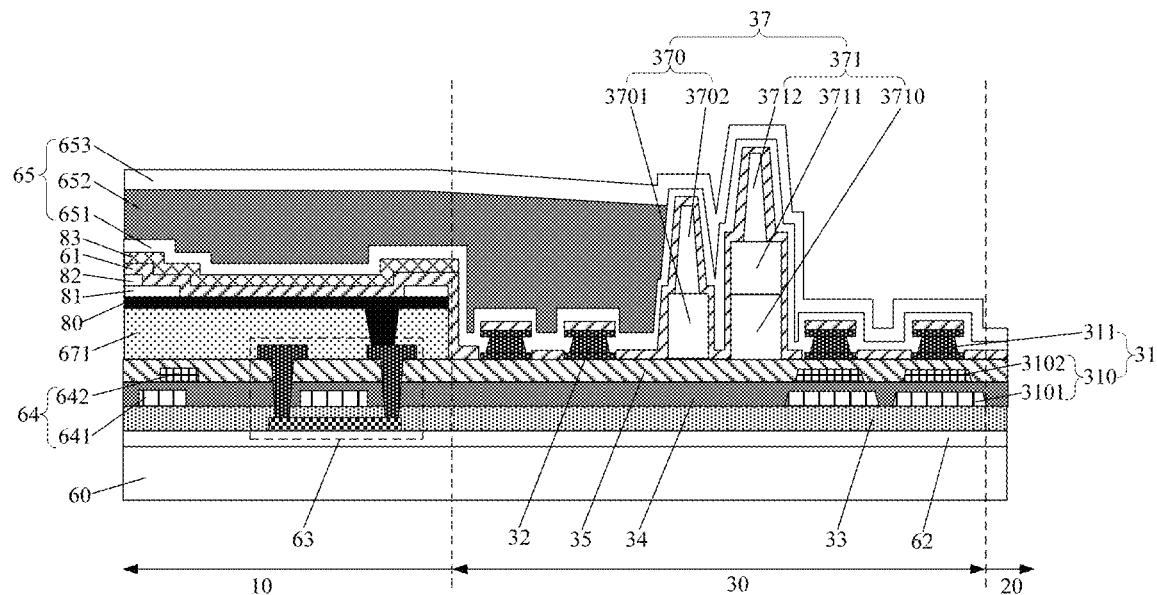
FIG. 3 is a first schematic sectional diagram in the N1N2 direction of FIG. 1.
Figure 4:
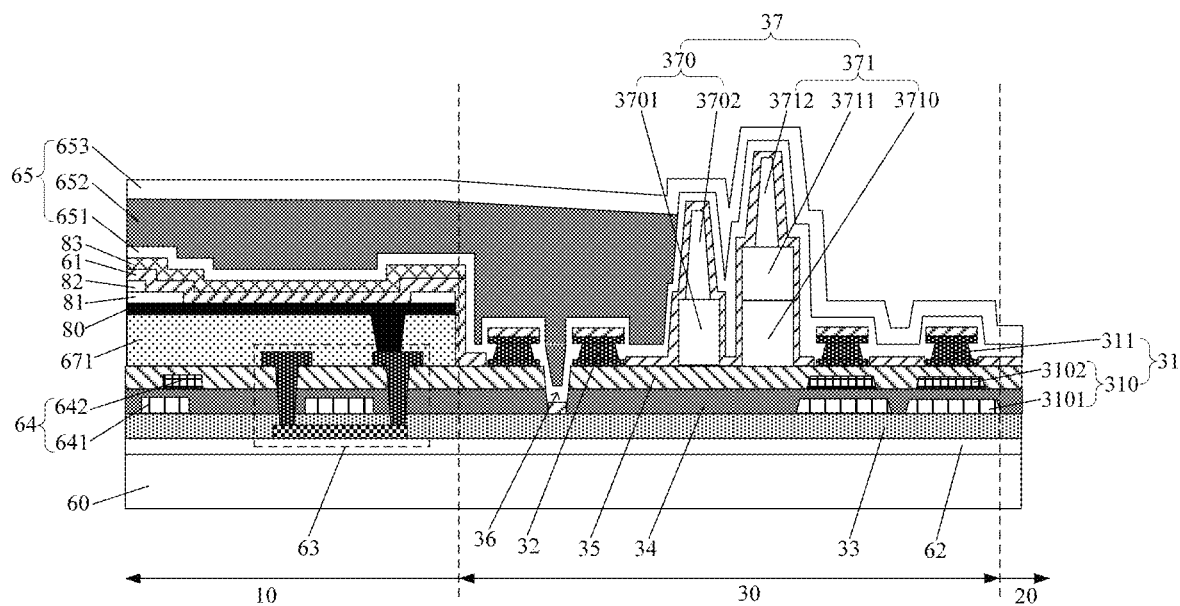
FIG. 4 is a second schematic sectional diagram in the N1N2 direction of FIG. 1.

As shown in FIG. 3 and FIG. 4, the light emission function layer 61 is located on a side of the first barrier structure 31 facing away from the base substrate 60. The light emission function layer 61 at least includes an organic light emission material layer. The organic light emission material layer includes an entire layer of organic light emission material for emitting white light, or includes organic light emission material layer patterns for emitting colored light (e.g., red light, green light, blue light and the like). Further, in addition to the organic light emission material layer, the light emission function layer 61 may include common layers with a complete layer structure, such as an electron transporting layer (ETL), an electron injection layer (EIL), a hole transporting layer (HTL) and a hole injection layer (HIL). The light emission function layer 61 may cover the pixel region 10 and the separation region 30, and may extend to the boundary of the hole region 20.

Figure 9:
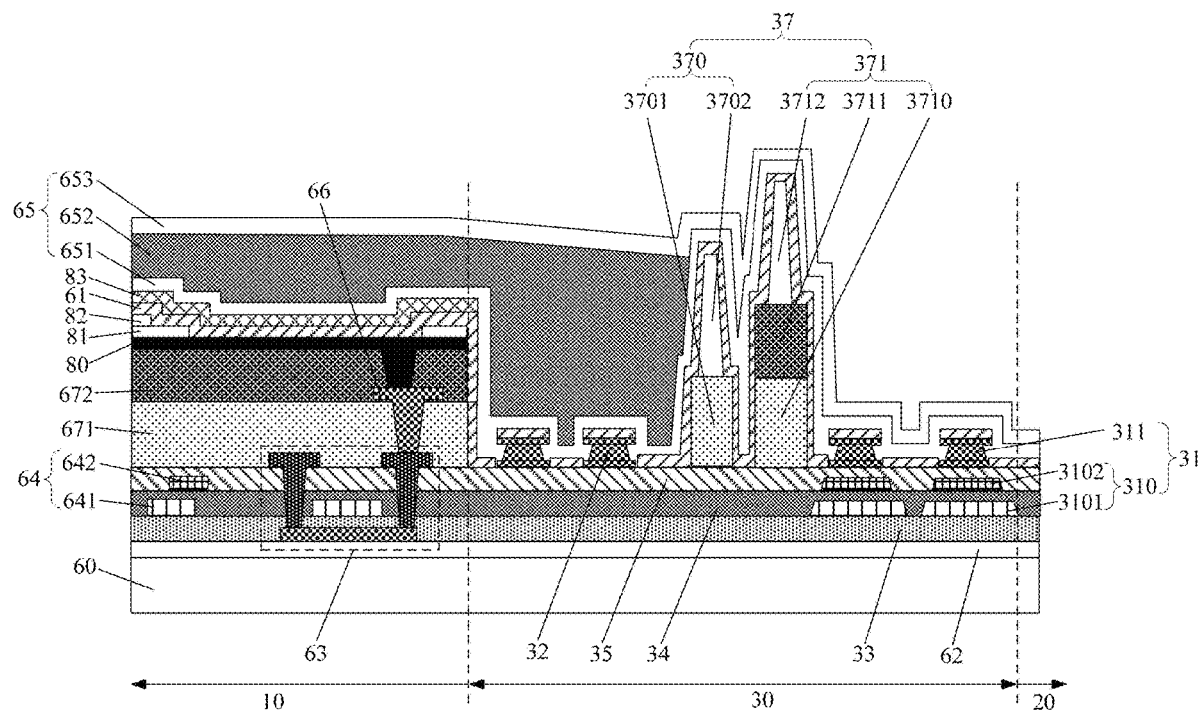
FIG. 9 is a third schematic sectional diagram in the N1N2 direction of FIG. 1.

It is noted, the light emission function layer 61 illustrated in FIG. 3, FIG. 4 and FIG. 9 includes the common layers, and in FIG. 3, FIG. 4 and FIG. 9, the reference numeral 80 denotes an anode pattern and the reference numeral 83 denotes a cathode layer.

The separation region 30 may be provided with one or more first barrier structures 31 on the base substrate 60. If one first barrier structure 31 is provided, the first barrier structure 31 should be as close to the boundary of the hole region 20 as possible. If multiple first barrier structures 31 are provided, the multiple first barrier structures 31 may be arranged sequentially in the direction away from the hole region 20 and be spaced apart. For example, it may be set that the first barrier structure 31 surrounds the hole region 20.

It is noted, according to the process conditions and effects, a quantity of the first barrier structures 31, a size of the first barrier structure 31 and a distance between the adjacent first barrier structures 31 all may be adjusted according to actual needs. For example, the quantity of the first barrier structures 31 ranges from one to ten, and a minimal distance between adjacent first barrier structures 31 may be set to greater than ten micrometers and no more than twenty micrometers. For example, as shown in FIG. 5, H4 is a width of the first barrier structure 31, and H5 is the distance between adjacent first barrier structures 31.

As shown in FIG. 3 and FIG. 4, the separation region 30 is provided with an inorganic layer structure on the base substrate 60, the inorganic layer structure includes multiple stacked inorganic film layers, and each of the inorganic film layers forms an integral structure with a corresponding inorganic film layer in the pixel region 10, which may serve as an insulation layer in the pixel region 10. The inorganic film layer has poor flexibility. When the hole region 20 is cut to form the hole, the inorganic layer at the cutting line tends to undergo brittle fracture, and the crack can easily propagate further to the pixel region 10 of the display substrate via the inorganic film layer, thereby impacting the yield of display screens.

Figure 5:
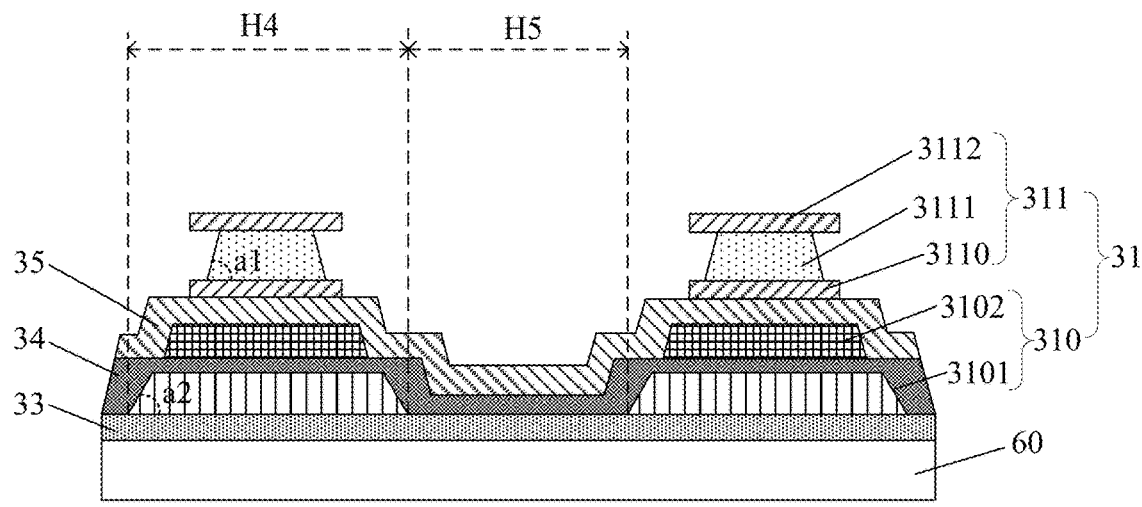
FIG. 5 is an enlarged view of the location of the first separation structure in FIG. 4.

As shown in FIG. 3, FIG. 4 and FIG. 5, the first barrier structure 31 includes: a stopper pattern 310 and a first separation component 311 sequentially stacked in a direction away from the base substrate 60. A quantity of the stopper patterns 310 may be set according to actual needs. Each stopper pattern 310 is located between two adjacent inorganic film layers, to separate adjacent inorganic film layers apart, thereby multiple inorganic film layers may be prevented from being stacked on each other and contacting each other, and a path for the crack to propagate to the pixel region 10 is blocked.

For example, the separation region 30 is provided with multiple first barrier structures 31, the inorganic layer structure may extend between the first separation components included in the first barrier structures 31 and the base substrate, the inorganic layer structure has a groove, and an orthographic projection of the groove onto the base substrate is located between orthographic projections of the adjacent first separation components onto the base substrate.

The pixel region 10 further includes a driver circuit layer between the base substrate 60 and the light emission function layer 61, wherein the driver circuit layer includes a conductive layer. For example, the stopper pattern 310 and the conductive layer are made on the same layer. In this manner of manufacturing, the stopper pattern 310 and the conductive layer may be made of the same material in a single patterning process, thereby facilitating a simplified manufacturing process flow of the display substrate and reducing the manufacturing costs.

Figure 6:
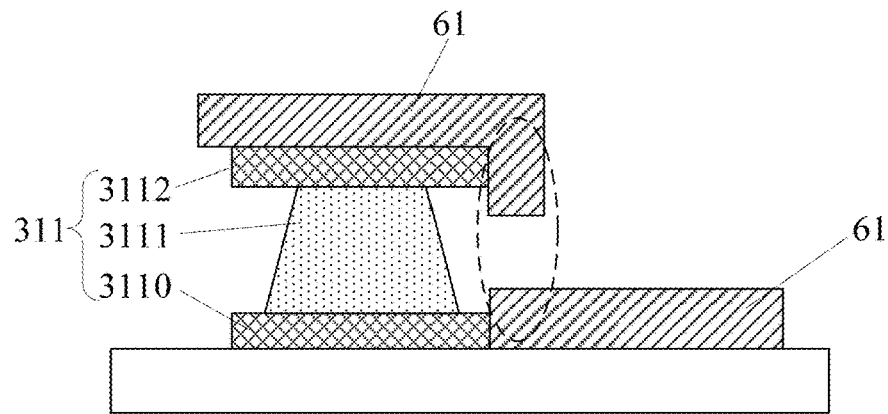
FIG. 6 is a schematic diagram illustrating a case in which the light emission function layer is disconnected on the side of the first separation component.

As shown in FIG. 5 and FIG. 6, the first separation component 311 is located on a side of the inorganic layer structure facing away from the base substrate 60, a side surface of the first separation component 311 has a recess, and a portion of the light emission function layer 61 that extends to the separation region 30 can be disconnected at the recess in the side surface of the first separation component 311 (as depicted by the dashed circle in FIG. 6). For example, it may be set that a section of the first separation component 311 in a direction perpendicular to the base substrate 60 is "I" shaped, but the present disclosure is not limited thereto.

It is noted, the stopper pattern 310 and the first separation component 311 included in each first barrier structure 31 may be arranged to surround the hole region 20, to enable the barrier function at any position around the hole region 20.

As can be known from the specific structure of the foregoing display substrate, in the display substrate according to the embodiment of the present disclosure, at least one first barrier structure 31 is provided in the separation region 30, the first barrier structure 31 includes: the stopper pattern 310 and the first separation component 311 sequentially stacked in a direction away from the base substrate 60, the stopper pattern 310 is located between two adjacent inorganic film layers in the separation region 30, to separate adjacent inorganic film layers apart, thereby multiple inorganic film layers may be adequately prevented from being stacked on each other and contacting each other, and a path for the crack to propagate to the pixel region 10 is blocked. The side surface of the first separation component 311 has a recess, and a portion of the light emission function layer 61 that extends to the separation region 30 can be disconnected at the recess in the side surface of the first separation component 311, thereby avoiding the problem that moisture and oxygen penetrate from the cutting line at the hole boundary into the interior of the display screen via the light emission function layer 61 and erode the interior of the display screen, leading to a display failure.

Moreover, in the display substrate according to the embodiment of the present disclosure, since the first separation component 311 is located on a side of the stopper pattern 310 and the inorganic layer structure that is facing away from the base substrate 60, a height of the first separation component 311 relative to the base substrate 60 is increased, thus it can be better ensured that the light emission function layer 61 is disconnected on the side of the first separation component 311, to prevent moisture and oxygen from intruding into the interior of the display substrate via the light emission function layer 61.

In addition, in each first barrier structure 31, the stopper pattern 310 and the first separation component 311 are stacked in a direction perpendicular to the base substrate 60, thus while the problems of crack propagation and moisture and oxygen intrusion are solved, the space occupied by the first barrier structure 31 is minimized, which facilitates the area reduction of the separation region 30, such that the display substrate may have a narrow bezel in the separation region 30.

Therefore, in the display substrate according to the embodiment of the present disclosure, by providing the first barrier structure 31 in the separation region 30, an effective encapsulation of the vicinity of the hole region 20 of the display substrate may be achieved after a thin film encapsulation process is performed, and the effectiveness and integrity of the thin film encapsulation is better ensured, such that the display substrate may have a narrow bezel in the separation region 30 while desirable encapsulation effect is ensured.

As shown in FIG. 5, in some embodiments, the stopper pattern 310 includes a first stopper pattern 3101 and a second stopper pattern 3102; the inorganic layer structure includes a first inorganic layer 33, a second inorganic layer 34 and a third inorganic layer 35 sequentially stacked in the direction away from the base substrate 60, the first stopper pattern 3101 is located between the first inorganic layer 33 and the second inorganic layer 34, and the second stopper pattern 3102 is located between the second inorganic layer 34 and the third inorganic layer 35.

In specific, both the first stopper pattern 3101 and the second stopper pattern 3102 can surround the hole region 20, but the present disclosure is not limited thereto.

In the foregoing manner of setting, the first stopper pattern 3101 can separate the first inorganic layer 33 and the second inorganic layer 34 apart, and the second stopper pattern 3102 can separate the second inorganic layer 34 and the third inorganic layer 35 apart, thereby the first inorganic layer 33, the second inorganic layer 34 and the third inorganic layer 35 may be prevented from being stacked on each other and contacting each other to provide a convenient path for the crack to propagate to the pixel region 10.

As shown in FIG. 3 and FIG. 4, in some embodiments, the driver circuit layer includes a transistor structure 63 and a capacitor structure 64, the transistor structure 63 includes an active layer, a gate electrode and a source-drain electrode layer sequentially stacked in the direction away from the base substrate 60, the source-drain electrode layer includes a source electrode and a drain electrode arranged in a same layer and made of a same material, the capacitor structure 64 includes a first electrode plate 641 and a second electrode plate 642 arranged oppositely in a direction perpendicular to the base substrate 60, the first electrode plate 641 and the gate electrode are arranged in a same layer and made of a same material, the second electrode plate 642 is located between the first electrode plate 641 and the source-drain electrode layer;

the first inorganic layer extends between the active layer and the gate electrode to act as a first gate insulation layer, the second inorganic layer 34 extends between the gate electrode and the second electrode plate 642 to act as a second gate insulation layer, and the third inorganic layer 35 extends between the second electrode plate 642 and the source-drain electrode layer to act as an interlayer dielectric layer;

the conductive layer includes the gate electrode and the second electrode plate, the first stopper pattern 3101 and the gate electrode are arranged in a same layer and made of a same material, and the second stopper pattern 3102 and the second electrode plate 642 are arranged in a same layer and made of a same material.

In specific, the driver circuit layer may include multiple sub-pixel driver circuits, each sub-pixel driver circuit may include a transistor structure 63 and a capacitor structure 64. For example, the sub-pixel driver circuit includes a 7T1C circuit structure.

The transistor structure 63 specifically includes an active layer, a gate electrode and a source-drain electrode layer sequentially stacked in the direction away from the base substrate 60, the source-drain electrode layer includes a source electrode and a drain electrode arranged in a same layer and made of a same material.

Specifically, the capacitor structure 64 may act as the storage capacitor in the sub-pixel driver circuit, but the present disclosure is not limited thereto. The capacitor structure 64 includes a first electrode plate 641 and a second electrode plate 642 arranged oppositely in a direction perpendicular to the base substrate 60, the first electrode plate 641 and the gate electrode may be arranged in a same layer and made of a same material. The second electrode plate 642 is located on a side of the first electrode plate 641 facing away from the base substrate 60, and is capable of forming an overlapping area with the first electrode plate 641. In specific, the second electrode plate 642 may be between the first electrode plate 641 and the source-drain electrode layer.

The pixel region 10 further includes a first gate insulation layer between the active layer and the gate electrode, a second gate insulation layer between the gate electrode and the second electrode plate 642, and an interlayer dielectric layer between the second electrode plate 642 and the source-drain electrode layer. For example, it may be set that the first inorganic layer extends between the active layer and the gate electrode to act as the first gate insulation layer, the second inorganic layer 34 extends between the gate electrode and the second electrode plate 642 to act as the second gate insulation layer, and the third inorganic layer 35 extends between the second electrode plate 642 and the source-drain electrode layer to act as the interlayer dielectric layer.

It is noted, the display substrate may further include a buffer layer 62 between the first inorganic layer 33 and the base substrate 60.

In the display substrate according to the foregoing embodiment, the first stopper pattern 3101 and the gate electrode are arranged in the same layer and made of the same material, and the second stopper pattern 3102 and the second electrode plate 642 are arranged in the same layer and made of the same material, such that the first stopper pattern 3101 and the gate electrode can be formed simultaneously in a single patterning process, and the second stopper pattern 3102 and the second electrode plate 642 can be formed simultaneously in a single patterning process, thereby facilitating a simplified manufacturing process flow of the display substrate and reducing the manufacturing costs of the display substrate.

In the display substrate according to the foregoing embodiment, by providing the stack structure of metal patterns (e.g., the first stopper pattern 3101 and the second stopper pattern 3102) and inorganic film layers (e.g., the first gate insulation layer, the second gate insulation layer and the interlayer dielectric layer) in the separation region 30, the propagation of crack to the pixel region 10 is effectively blocked, and the yield of display substrates is effectively improved.

As shown in FIG. 3, in some embodiments, the separation region 30 is further provided with at least one second separation component 32 on the base substrate 60, and an orthographic projection of the second separation component 32 onto the base substrate 60 is located on a side of an orthographic projection of the first barrier structure 31 onto the base substrate 60 which is away from the hole region 20; a side surface of the second separation component 32 has a recess, and a portion of the light emission function layer 61 extending to the separation region 30 is disconnected on the side of the second separation component 32.

In specific, the separation region 30 may further be provided with at least one second separation component 32. The second separation component 32 may have a same specific structure as the first separation component 311. An orthographic projection of the second separation component 32 onto the base substrate 60 is located on a side of an orthographic projection of the first barrier structure 31 onto the base substrate 60, the side of the orthographic projection of the first barrier structure 31 onto the base substrate 60 being away from the hole region 20.

It is noted, each second separation component 32 may be arranged to surround the hole region 20, to enable the barrier function at any position around the hole region 20.

In the display substrate according to the foregoing embodiment, it is set that a side surface of the second separation component 32 has a recess, and a portion of the light emission function layer 61 extending to the separation region 30 can be disconnected at the recess in the side surface of the second separation component 32, thereby further avoiding the problem that moisture and oxygen penetrate from the cutting line at the hole boundary into the interior of the display screen via the light emission function layer 61 and erode the interior of the display screen, leading to a display failure.

In some embodiments, the separation region 30 is further provided with a stopper pattern between the base substrate 60 and the second separation component 32. A quantity of the stopper patterns may be set according to actual needs. Each stopper pattern is located between two adjacent inorganic film layers, to separate adjacent inorganic film layers apart, thereby multiple inorganic film layers may be prevented from being stacked on each other and contacting each other, and a path for the crack to propagate to the pixel region 10 is blocked.

For example, the stopper pattern and the conductive layer are made on the same layer. In this manner of manufacturing, the stopper pattern and the conductive layer may be made of the same material in a single patterning process, thereby facilitating a simplified manufacturing process flow of the display substrate and reducing the manufacturing costs.

Figure 7:
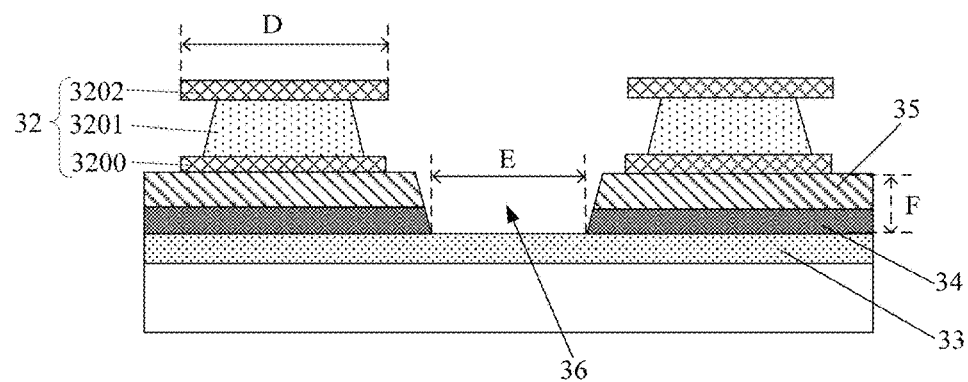
FIG. 7 is an enlarged view of the location of the second separation component in FIG. 4.

As shown in FIG. 4 and FIG. 7, in some embodiments, the separation region 30 is provided with multiple spaced-apart second separation components 32; the inorganic layer structure extends between the multiple second separation components 32 and the base substrate 60, the inorganic layer structure has a groove 36, and an orthographic projection of the groove 36 onto the base substrate 60 is located between orthographic projections of the adjacent second separation components 32 onto the base substrate 60.

In specific, the separation region 30 may further be provided with the multiple second separation components 32, which are all located on a side of the inorganic layer structure facing away from the base substrate 60. Further, the groove 36 may be formed in the inorganic layer structure between the adjacent second separation components 32 by using an etching process, to increase a height difference between a surface of the second separation component 32 facing away from the base substrate 60 and a bottom of the groove 36, so that the light emission function layer 61 is easier to be disconnected on the edge of the second separation component 32, thereby effectively improving the reliability of separating the light emission function layer 61 by using the second separation component 32.

It is noted, each second separation component 32 and the groove 36 may be arranged to surround the hole region 20, to enable the separation of the light emission function layer 61 in any direction around the hole region 20.

In some embodiments, the inorganic layer structure includes a first gate insulation layer, a second gate insulation layer and an interlayer dielectric layer sequentially stacked in the direction away from the base substrate 60, and the groove 36 passes through the first gate insulation layer, the second gate insulation layer and the interlayer dielectric layer in a direction perpendicular to the base substrate 60.

In specific, the pixel region 10 further includes the first gate insulation layer between the active layer and the gate electrode, the second gate insulation layer between the gate electrode and the second electrode plate 642, and the interlayer dielectric layer between the second electrode plate 642 and the source-drain electrode layer. For example, the first gate insulation layer, the second gate insulation layer and the interlayer dielectric layer all can extend to the separation region 30, and together form the inorganic layer structure in the separation region 30.

The etching depth of the groove 36 can be adjusted according to actual needs. For example, the groove 36 only passes through the interlayer dielectric layer; or as shown in FIG. 7, the groove 36 passes through both the interlayer dielectric layer and the second gate insulation layer; or the groove 36 passes through all of the first gate insulation layer, the second gate insulation layer and the interlayer dielectric layer.

If it is set that the groove 36 passes through all of the first gate insulation layer, the second gate insulation layer and the interlayer dielectric layer, a height difference between a surface of the second separation component 32 facing away from the base substrate 60 and a bottom of the groove 36 can be increased to the utmost extent, so that the light emission function layer 61 is easier to be disconnected on the edge of the second separation component 32, thereby improving to the utmost extent the reliability of separating the light emission function layer 61 by using the second separation component 32.

In some embodiments, it may be set that a depth of the groove 36 in the direction perpendicular to the base substrate 60 ranges from 6000 Å to 8000 Å.

In specific, the depth of the groove 36 may be chosen from the range of 6000 Å to 8000 Å (with both endpoints inclusive). For example, the depth of the groove 36 is set to 7000 Å.

Since the light emission function layer 61 usually has a thickness of 3000 Å, and the second separation component 32 usually has a thickness of 6000 Å if the second separation component 32 is made from the source-drain metal layer, disconnection of the light emission function layer 61 on the edge of the second separation component 32 can be better ensured if it is set that the depth of the groove 36 ranges from 6000 Å to 8000 Å.

As shown in FIG. 7, D represents the width of the second separation component 32, E represents the etching width of the inorganic layer structure between adjacent second separation components 32, and F represents the etching depth of the inorganic layer structure below the second separation component 32.

It is noted, according to the process conditions and effects, a quantity of the second separation components 32, a size of the second separation component 32, a distance between the adjacent second separation components 32, the depth of the groove 36 and the width of the groove 36 all may be adjusted according to actual needs. For example, the quantity of the second separation components 32 ranges from one to ten, and a minimal distance between adjacent second separation components 32 may be set to greater than ten micrometers and no more than twenty micrometers.

As shown in FIG. 6, in some embodiments, the first separation component 311 includes a first function pattern 3110, a second function pattern 3111 and a third function pattern 3112 sequentially stacked in the direction away from the base substrate 60, an orthographic projection of the first function pattern 3110 onto the base substrate 60 surrounds an orthographic projection of the second function pattern 3111 onto the base substrate 60, an orthographic projection of the third function pattern 3112 onto the base substrate 60 surrounds the orthographic projection of the second function pattern 3111 onto the base substrate 60; and/or, as shown in FIG. 7, the second separation component 32 includes a fourth function pattern 3200, a fifth function pattern 3201 and a sixth function pattern 3202 sequentially stacked in the direction away from the base substrate 60, an orthographic projection of the fourth function pattern 3200 onto the base substrate 60 surrounds an orthographic projection of the fifth function pattern 3201 onto the base substrate 60, an orthographic projection of the sixth function pattern 3202 onto the base substrate 60 surrounds the orthographic projection of the fifth function pattern 3201 onto the base substrate 60.

In specific, by means of the foregoing settings that the first separation component 311 includes the first function pattern 3110, the second function pattern 3111 and the third function pattern 3112, and the second separation component 32 includes the fourth function pattern 3200, the fifth function pattern 3201 and the sixth function pattern 3202, both the first separation component 311 and the second separation component 32 may be formed into a structure with an "I" shaped longitudinal section, thereby facilitating the disconnection of the light emission function layer 61 on the edge of the first separation component 311 and the second separation component 32.

As shown in FIG. 5, in some embodiments, it may be set that an orthographic projection of the first stopper pattern 3101 onto the base substrate 60 covers an orthographic projection of the second stopper pattern 3102 onto the base substrate 60, and the orthographic projection of the second stopper pattern 3102 onto the base substrate 60 covers the orthographic projection of the first separation component 311 onto the base substrate 60.

By means of the foregoing setting, both the first stopper pattern 3101 and the second stopper pattern 3102 have a relatively large area, which helps to improve their crack-blocking effect.

As shown in FIG. 5, in some embodiments, the second function pattern 3111 has a first slope angle a1, the first stopper pattern 3101 has a second slope angle a2, and the first slope angle a1 is greater than the second slope angle a2.

By means of the setting that the first slope angle a1 is greater than the second slope angle a2, the second function pattern 3111 may be recessed deeper between the first function pattern 3110 and the third function pattern 3112, thereby facilitating the disconnection of the light emission function layer 61 on the edge of the first separation component 311.

As shown in FIG. 3 and FIG. 4, in some embodiments, the pixel region 10 is further provided with a transistor structure 63 between the base substrate 60 and the light emission function layer 61, the transistor structure 63 includes an active layer, a gate electrode and a source-drain electrode layer sequentially stacked in the direction away from the base substrate 60, the source-drain electrode layer includes a source electrode and a drain electrode arranged in a same layer and made of a same material, and both the source electrode and the drain electrode include a first metal sub-film layer, a second metal sub-film layer and a third metal sub-film layer sequentially stacked in the direction away from the base substrate 60;

the first function pattern 3110 and the first metal sub-film layer are arranged in a same layer and made of a same material, the second function pattern 3111 and the second metal sub-film layer are arranged in a same layer and made of a same material, the third function pattern 3112 and the third metal sub-film layer are arranged in a same layer and made of a same material; and/or, the fourth function pattern 3200 and the first metal sub-film layer are arranged in a same layer and made of a same material, the fifth function pattern 3201 and the second metal sub-film layer are arranged in a same layer and made of a same material, the sixth function pattern 3202 and the third metal sub-film layer are arranged in a same layer and made of a same material.

In specific, the source electrode and the drain electrode may have a variety of specific structures and may be made of a variety of materials. For example, both the source electrode and the drain electrode include the first metal sub-film layer, the second metal sub-film layer and the third metal sub-film layer sequentially stacked in the direction away from the base substrate 60. Both the first metal sub-film layer and the third metal sub-film layer are made of titanium (Ti), and the second sub-film layer is made of aluminum (Al), such that both the source electrode and the drain electrode are formed as a stacked Ti—Al—Ti structure.

In the display substrate according to the foregoing embodiment, the first function pattern 3110 and the first metal sub-film layer are arranged in a same layer and made of a same material, the second function pattern 3111 and the second metal sub-film layer are arranged in a same layer and made of a same material, the third function pattern 3112 and the third metal sub-film layer are arranged in a same layer and made of a same material; and the fourth function pattern 3200 and the first metal sub-film layer are arranged in a same layer and made of a same material, the fifth function pattern 3201 and the second metal sub-film layer are arranged in a same layer and made of a same material, the sixth function pattern 3202 and the third metal sub-film layer are arranged in a same layer and made of a same material, such that both the first separation component 311 and the second separation component 32 may be formed along with the source electrode and the drain electrode in a single patterning process, thereby effectively simplifying the manufacturing process flow of the display substrate and reducing the manufacturing costs of the display substrate.

It is noted, if the first separation component 311 and the second separation component 32 adopt the foregoing structure, the step of forming the first separation component 311, the second separation component 32, the source electrode and the drain electrode simultaneously in a single patterning process specifically includes:

sequentially depositing a first metal material layer, a second metal material layer and a third metal material layer to form stacked first, second and third metal material layers;

manufacturing a photoresist layer on a side of the third metal material layer facing away from the base substrate 60; exposing the photoresist layer by using a mask to form a photoresist-retained region and a photoresist-removed region, wherein the photoresist-retained region corresponds to the locations of the first separation component 311, the second separation component 32, the source electrode and the drain electrode, and the photoresist-removed region corresponds to a region other than the locations of the first separation component 311, the second separation component 32, the source electrode and the drain electrode; removing the photoresist layer in the photoresist-removed region to reveal the third metal material layer in the photoresist-removed region;

etching, by using a dry etch process, the third metal material layer, the second metal material layer and the first metal material layer in the photoresist-removed region, to form the source electrode, the drain electrode, a first transition structure for forming the first separation component 311 and a second transition structure for forming the second separation component 32; then stripping the remaining photoresist layer;

continuing to manufacture the anode pattern in the pixel region 10, and while etching by using a etchant (e.g., nitric acid) to form the anode pattern, etching the first and second transition structures by using the etchant to form the first separation component 311 and the second separation component 32 with an "I" shaped structure.

As shown in FIG. 9, in some embodiments, the display substrate further includes a first source-drain metal layer and a second source-drain metal layer 66 sequentially stacked in the direction away from the base substrate 60 on the base substrate 60, the second source-drain metal layer 66 includes a fourth metal sub-film layer, a fifth metal sub-film layer and a sixth metal sub-film layer sequentially stacked in the direction away from the base substrate 60.

Figure 10:
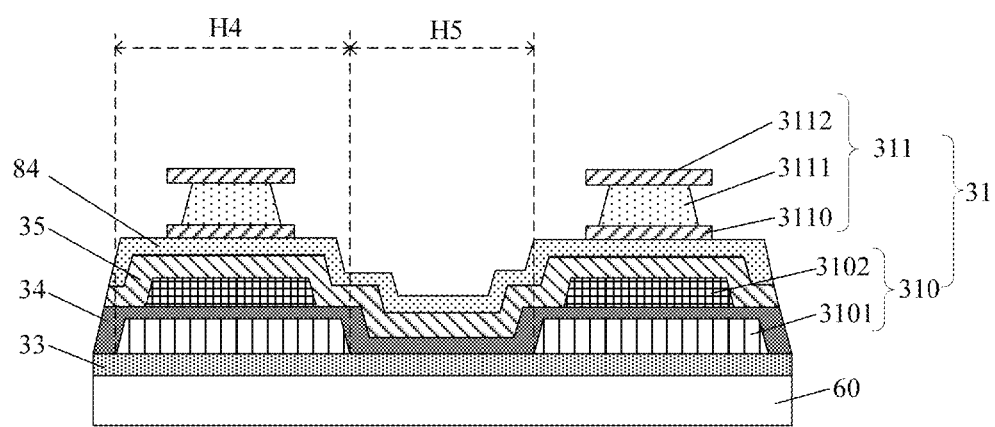
FIG. 10 is an enlarged view of the location of the first separation structure in FIG. 9

As shown in FIG. 7, FIG. 9 and FIG. 10, the first function pattern 3110 and the fourth metal sub-film layer are arranged in a same layer and made of a same material, the second function pattern 3111 and the fifth metal sub-film layer are arranged in a same layer and made of a same material, the third function pattern 3112 and the sixth metal sub-film layer are arranged in a same layer and made of a same material; and/or, the fourth function pattern 3200 and the fourth metal sub-film layer are arranged in a same layer and made of a same material, the fifth function pattern 3201 and the fifth metal sub-film layer are arranged in a same layer and made of a same material, the sixth function pattern 3202 and the sixth metal sub-film layer are arranged in a same layer and made of a same material.

In specific, the display substrate further includes a first source-drain metal layer and a second source-drain metal layer 66 sequentially stacked in the direction away from the base substrate 60 on the base substrate 60. The first source-drain metal layer is used to form the source electrode and the drain electrode of the transistor structure 63, and a power line and a data line included in the display substrate. The second source-drain metal layer 66 is generally used to form some conductive connection portions in the display substrate. It is noted, a passivation layer 84 in FIG. 10 is located between a first planarization layer 671 and the first source-drain metal layer, and is capable of protecting the first source-drain metal layer.

For example, the second source-drain metal layer 66 includes a fourth metal sub-film layer, a fifth metal sub-film layer and a sixth metal sub-film layer sequentially stacked in the direction away from the base substrate 60. Both the fourth metal sub-film layer and the sixth metal sub-film layer are made of titanium (Ti), and the fifth metal sub-film layer is made of aluminum (Al), such that the second source-drain metal layer 66 is formed as a stacked Ti—Al—Ti structure.

In the display substrate according to the foregoing embodiment, the first function pattern 3110 and the fourth metal sub-film layer are arranged in a same layer and made of a same material, the second function pattern 3111 and the fifth metal sub-film layer are arranged in a same layer and made of a same material, the third function pattern 3112 and the sixth metal sub-film layer are arranged in a same layer and made of a same material; and, the fourth function pattern 3200 and the fourth metal sub-film layer are arranged in a same layer and made of a same material, the fifth function pattern 3201 and the fifth metal sub-film layer are arranged in a same layer and made of a same material, the sixth function pattern 3202 and the sixth metal sub-film layer are arranged in a same layer and made of a same material, such that both the first separation component 311 and the second separation component 32 may be formed along with the second source-drain metal layer 66 in a single patterning process, thereby effectively simplifying the manufacturing process flow of the display substrate and reducing the manufacturing costs of the display substrate.

As shown in FIG. 4 and FIG. 9, in some embodiments, the separation region 30 is further provided with: a dam structure 37 on the base substrate 60, an orthographic projection of the dam structure 37 onto the base substrate 60 being between the orthographic projection of the first barrier structure 31 onto the base substrate 60 and the orthographic projection of the second separation component 32 onto the base substrate 60; an encapsulation structure 65 extending from the pixel region 10 to the separation region 30, wherein the encapsulation structure 65 includes a first inorganic encapsulation layer 651, an organic encapsulation layer 652 and a second inorganic encapsulation layer 653 sequentially stacked in the direction away from the base substrate 60; the first inorganic encapsulation layer 651 and the second inorganic encapsulation layer 653 completely cover the first barrier structure 31, the second separation component 32 and the dam structure 37; an orthographic projection of the organic encapsulation layer 652 onto the base substrate 60 is located on a side of the orthographic projection of the dam structure 37 onto the base substrate 60, the side of the orthographic projection of the dam structure 37 onto the base substrate 60 being away from the hole region 20.

In specific, the dam structure 37 may have a variety of specific structures. For example, an orthographic projection of the dam structure 37 onto the base substrate 60 is located between an orthographic projection of the first barrier structure 31 onto the base substrate 60 and an orthographic projection of the second separation component 32 onto the base substrate 60, and the dam structure 37 may surround the hole region 20.

The display substrate further includes the encapsulation structure 65. The encapsulation structure 65 generally includes the first inorganic encapsulation layer 651, the organic encapsulation layer 652 and the second inorganic encapsulation layer 653 sequentially stacked in the direction away from the base substrate 60; the first inorganic encapsulation layer 651 and the second inorganic encapsulation layer 653 may completely cover the first barrier structure 31, the second separation component 32 and the dam structure 37. The dam structure 37 may block the overflow of an organic encapsulation material used for manufacturing the organic encapsulation layer 652 during a process of manufacturing the organic encapsulation layer 652, so as to confine the organic encapsulation material to a side of the dam structure 37 that is facing away from the hole region 20.

It is noted, both the first inorganic encapsulation layer 651 and the second inorganic encapsulation layer 653 can be formed by using a chemical vapor deposition process. The organic encapsulation layer 652 may be formed by using an ink jet printing process.

As shown in FIG. 4 and FIG. 9, in some embodiments, the dam structure 37 includes a first dam component 370 and a second dam component 371 sequentially arranged in a direction towards the hole region 20, a height of a surface of the first dam component 370 facing away from the base substrate 60 is lower than a height of a surface of the second dam component 371 facing away from the base substrate 60.

In specific, the barrier structure may have a variety of specific structures. For example, the dam structure 37 includes multiple dam components sequentially arranged in the direction towards the hole region 20, and heights of the multiple dam components in the direction perpendicular to the base substrate 60 sequentially increase in the direction towards the hole region 20.

For example, it may be set that the dam structure 37 includes a first dam component 370 and a second dam component 371 sequentially arranged in a direction towards the hole region 20. Both the first dam component 370 and the second dam component 371 can surround the hole region 20. If the dam structure 37 with the foregoing structure is provided in the display substrate, not only the organic encapsulation layer 652 is effectively blocked, but also smaller layout space is occupied by the dam structure 37.

Figure 8:
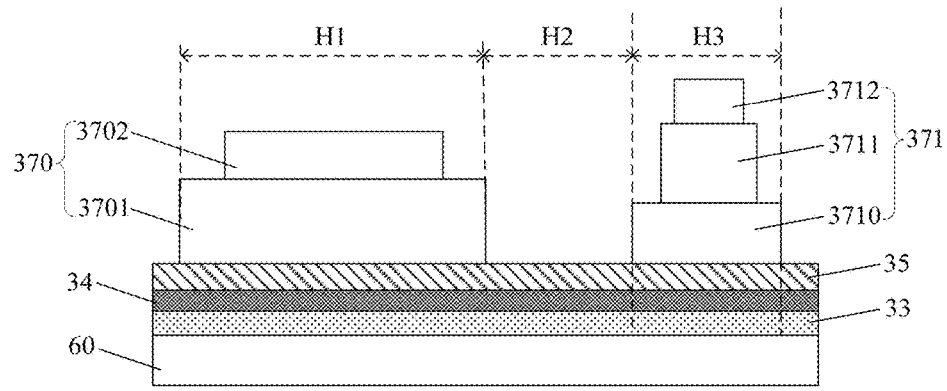
FIG. 8 is an enlarged view of the location of the dam structure 37 in FIG. 4.

As shown in FIG. 3, FIG. 4 and FIG. 8, in some embodiments, the pixel region 10 is further provided with a pixel definition layer 81 and a spacer layer 82 sequentially stacked in the direction away from the base substrate 60 on the base substrate 60; the first dam component 370 includes a first dam pattern 3701 and a second dam pattern 3702 sequentially stacked in the direction away from the base substrate 60, the first dam pattern 3701 and the pixel definition layer 81 are arranged in a same layer and made of a same material, and the second dam pattern 3702 and the spacer layer 82 are arranged in a same layer and made of a same material.

In specific, the pixel region 10 is further provided with the pixel definition layer 81 and the spacer layer 82. The pixel definition layer 81 is used to form a pixel opening in the pixel region 10. The spacer layer 82 is located on a side of the pixel definition layer 81 facing away from the base substrate 60, and functions as a support in the display substrate.

It is noted, in FIG. 8, H1 represents a width of the first dam component 370, H2 represents a distance between the first dam component 370 and the second dam component 371, and H3 represents a width of the second dam component 371.

By means of the foregoing settings that the first dam pattern 3701 and the pixel definition layer 81 are arranged in a same layer and made of a same material, and the second dam pattern 3702 and the spacer layer 82 are arranged in a same layer and made of a same material, the first dam pattern 3701 and the pixel definition layer 81 may be formed in a single patterning process, and the second dam pattern 3702 and the spacer layer 82 may be formed in a single patterning process, thereby facilitating a simplified manufacturing process flow of the display substrate and reducing the manufacturing costs.

As shown in FIG. 8, in some embodiments, the pixel region 10 is further provided with a planarization layer, a pixel definition layer 81 and a spacer layer 82 sequentially stacked in the direction away from the base substrate 60 on the base substrate 60; the second dam component 371 includes a third dam pattern 3710, a fourth dam pattern 3711 and a fifth dam pattern 3712 sequentially stacked in the direction away from the base substrate 60, the third dam pattern 3710 and the planarization layer are arranged in a same layer and made of a same material, the fourth dam pattern 3711 and the pixel definition layer 81 are arranged in a same layer and made of a same material, and the fifth dam pattern 3712 and the spacer layer 82 are arranged in a same layer and made of a same material.

In specific, the pixel region 10 is provided with the driver circuit layer, the planarization layer on a side of the driver circuit layer facing away from the base substrate 60, an anode layer on a side of the planarization layer facing away from the base substrate 60, the pixel definition layer 81 on a side of the anode layer facing away from the base substrate 60, and the spacer layer 82 on a side of the pixel definition layer 81 facing away from the base substrate 60.

The driver circuit layer includes multiple sub-pixel driver circuits, the anode layer includes anode patterns in one-to-one correspondence with the sub-pixel driver circuits, and the pixel definition layer defines pixel openings in one-to-one correspondence with the anode patterns. An orthographic projection of each pixel opening onto the base substrate 60 is surrounded by an orthographic projection of the corresponding anode pattern onto the base substrate 60. Each pixel opening is provided with a correspondingly colored organic light emission material layer.

By means of the foregoing settings that the third dam pattern 3710 and the planarization layer are arranged in a same layer and made of a same material, the fourth dam pattern 3711 and the pixel definition layer 81 are arranged in a same layer and made of a same material, and the fifth dam pattern 3712 and the spacer layer 82 are arranged in a same layer and made of a same material, the third dam pattern 3710 and the planarization layer may be formed in a single patterning process, the fourth dam pattern 3711 and the pixel definition layer 81 may be formed in a single patterning process, and the fifth dam pattern 3712 and the spacer layer 82 may be formed in a single patterning process, thereby facilitating a simplified manufacturing process flow of the display substrate and reducing the manufacturing costs.

As shown in FIG. 9, in some embodiments, the pixel region 10 is further provided with a first planarization layer 671, a second planarization layer 672, and a pixel definition layer 81 sequentially stacked in the direction away from the base substrate 60 on the base substrate 60; the second dam component 371 includes a third dam pattern 3710, a fourth dam pattern 3711 and a fifth dam pattern 3712 sequentially stacked in the direction away from the base substrate 60, the third dam pattern 3710 and the first planarization layer 671 are arranged in a same layer and made of a same material, the fourth dam pattern 3711 and the second planarization layer 672 are arranged in a same layer and made of a same material, and the fifth dam pattern 3712 and the pixel definition layer 81 are arranged in a same layer and made of a same material.

In specific, in the case that the display substrate adopts a process with dual source-drain metal layers, the pixel region 10 is provided with the driver circuit layer, the first planarization layer 671 on a side of the driver circuit layer facing away from the base substrate 60, a second source-drain metal layer 66 on a side of the first planarization layer 671 facing away from the base substrate 60, the second planarization layer 672 on a side of the second source-drain metal layer 66 facing away from base substrate 60, an anode layer on a side of the second planarization layer 672 facing away from the base substrate 60, the pixel definition layer 81 on a side of the anode layer facing away from the base substrate 60, and the spacer layer 82 on a side of the pixel definition layer 81 facing away from the base substrate 60.

The driver circuit layer includes multiple sub-pixel driver circuits. Each sub-pixel driver circuit includes multiple transistor structures 63. The driver circuit layer includes the first source-drain metal layer used for forming the source electrodes and the drain electrodes of the transistor structures 63, wherein the first source-drain metal layer and the second source-drain metal layer are the dual source-drain metal layers.

By means of the foregoing settings that the third dam pattern 3710 and the first planarization layer 671 are arranged in a same layer and made of a same material, the fourth dam pattern 3711 and the second planarization layer 672 are arranged in a same layer and made of a same material, and the fifth dam pattern 3712 and the pixel definition layer 81 are arranged in a same layer and made of a same material, the third dam pattern 3710 and the first planarization layer 671 may be formed in a single patterning process, the fourth dam pattern 3711 and the second planarization layer 672 may be formed in a single patterning process, and the fifth dam pattern 3712 and the pixel definition layer 81 may be formed in a single patterning process, thereby facilitating a simplified manufacturing process flow of the display substrate and reducing the manufacturing costs.

As shown in FIG. 9, in some embodiments, the pixel region 10 is further provided with a first planarization layer 671, a second planarization layer 672, and a pixel definition layer 81 sequentially stacked in the direction away from the base substrate 60 on the base substrate 60; the first dam component 370 includes a first dam pattern 3701 and a second dam pattern 3702 sequentially stacked in the direction away from the base substrate 60, the first dam pattern 3701 and the first planarization layer 671 are arranged in a same layer and made of a same material, and the second dam pattern 3702 and the pixel definition layer 81 are arranged in a same layer and made of a same material.

In specific, by means of the foregoing settings that the first dam pattern 3701 and the first planarization layer 671 are arranged in a same layer and made of a same material, and the second dam pattern 3702 and the pixel definition layer 81 are arranged in a same layer and made of a same material, the first dam pattern 3701 and the first planarization layer 671 may be formed in a single patterning process, and the second dam pattern 3702 and the pixel definition layer 81 may be formed in a single patterning process, thereby facilitating a simplified manufacturing process flow of the display substrate and reducing the manufacturing costs.

The first barrier structure 31, the second separation component 32 and the dam structure 37 included in the display substrate according to the foregoing embodiment all can be formed along with other functional film layers of the display substrate in a single patterning process. Thus, there is no need to add processes dedicated for the manufacture of the first barrier structure 31, the second separation component 32 and the dam structure 37, thereby better ensuring the productivity.

An embodiment of the present disclosure further provides a display device including the display substrate according to the foregoing embodiment.

In the display substrate according to the foregoing embodiment, at least one first barrier structure 31 is provided in the separation region 30, the first barrier structure 31 includes: the stopper pattern 310 and the first separation component 311 sequentially stacked in a direction away from the base substrate 60, the stopper pattern 310 is located between two adjacent inorganic film layers in the separation region 30, to separate adjacent inorganic film layers apart, thereby avoiding the problem that a convenient path for the crack to propagate to the pixel region 10 is generated due to the fact that multiple inorganic film layers are stacked on each other and contacting each other. The side surface of the first separation component 311 has a recess, and a portion of the light emission function layer 61 that extends to the separation region 30 can be disconnected at the recess in the side surface of the first separation component 311, thereby avoiding the problem that moisture and oxygen penetrate from the cutting line at the hole boundary into the interior of the display screen via the light emission function layer 61 and erode the interior of the display screen, leading to a display failure.

Moreover, in the display substrate according to the embodiment of the present disclosure, since the first separation component 311 is located on a side of the stopper pattern 310 and the inorganic layer structure that is facing away from the base substrate 60, a height of the first separation component 311 relative to the base substrate 60 is increased, thus it can be better ensured that the light emission function layer 61 is disconnected on the side of the first separation component 311, to prevent moisture and oxygen from intruding into the interior of the display substrate via the light emission function layer 61.

In addition, in each first barrier structure 31, the stopper pattern 310 and the first separation component 311 are stacked in a direction perpendicular to the base substrate 60, thus while the problems of crack propagation and moisture and oxygen intrusion are solved, the space occupied by the first barrier structure 31 is minimized, which facilitates the area reduction of the separation region 30, such that the display substrate may have a narrow bezel in the separation region 30.

As a result, in the case that the display device according to the embodiment of the present disclosure includes the foregoing display substrate, by providing the first barrier structure in the separation region 30, an effective encapsulation of the vicinity of the hole region 20 of the display substrate may be achieved after a thin film encapsulation process is performed, and the effectiveness and integrity of the thin film encapsulation is better ensured, such that the display substrate may met the demand for the development towards higher resolution while desirable encapsulation effect is ensured.

It is noted, the display device may be any product or component having a display function, such as a TV, a display, a digital photo frame, a cell phone, or a tablet computer.

An embodiment of the present disclosure further provides a method for manufacturing a display substrate. The method is used to manufacture the display substrate according to the foregoing embodiment, the display substrate having a display region, the display region including a pixel region 10, a hole region 20 and a separation region 30 located between the pixel region 10 and the hole region 20 and surrounding the hole region 20, wherein the method includes:

manufacturing a driver circuit layer on a base substrate in the pixel region 10, wherein the driver circuit layer includes a conductive layer;

manufacturing an inorganic layer structure and at least one first barrier structure 31 on the base substrate 60 in the separation region 30; wherein the first barrier structure 31 includes: a stopper pattern 310 and a first separation component 311 sequentially stacked in a direction away from the base substrate 60, the stopper pattern 310 and the conductive layer are made on the same layer, a side surface of the first separation component 311 has a recess, the inorganic layer structure includes multiple stacked inorganic film layers, the stopper pattern 310 is located between two adjacent inorganic film layers and the first separation component 311 is located on a side of the inorganic layer structure facing away from the base substrate 60;

forming a light emission function layer 61 in the pixel region 10 and the separation region 30 on the base substrate 60 formed with the driver circuit layer, the inorganic layer structure and the at least one first barrier structure 31, wherein a portion of the light emission function layer 61 in the separation region 30 is disconnected on the side of the first separation component 311.

In the display substrate manufactured by using the method according to the foregoing embodiment, at least one first barrier structure 31 is provided in the separation region 30, the first barrier structure 31 includes: the stopper pattern 310 and the first separation component 311 sequentially stacked in a direction away from the base substrate 60, the stopper pattern 310 is located between two adjacent inorganic film layers in the separation region 30, to separate adjacent inorganic film layers apart, thereby avoiding the problem that a convenient path for the crack to propagate to the pixel region 10 is generated due to the fact that multiple inorganic film layers are stacked on each other and contacting each other. The side surface of the first separation component 311 has a recess, and a portion of the light emission function layer 61 that extends to the separation region 30 can be disconnected at the recess in the side surface of the first separation component 311, thereby avoiding the problem that moisture and oxygen penetrate from the cutting line at the hole boundary into the interior of the display screen via the light emission function layer 61 and erode the interior of the display screen, leading to a display failure.

Moreover, in the display substrate manufactured by using the method according to the foregoing embodiment, since the first separation component 311 is located on a side of the stopper pattern 310 and the inorganic layer structure that is facing away from the base substrate 60, a height of the first separation component 311 relative to the base substrate 60 is increased, thus it can be better ensured that the light emission function layer 61 is disconnected on the side of the first separation component 311, to prevent moisture and oxygen from intruding into the interior of the display substrate via the light emission function layer 61.

In addition, in each first barrier structure 31, the stopper pattern 310 and the first separation component 311 are stacked in a direction perpendicular to the base substrate 60, thus while the problems of crack propagation and moisture and oxygen intrusion are solved, the space occupied by the first barrier structure 31 is minimized, which facilitates the area reduction of the separation region 30, so as to meet the demand for the display substrate to develop towards higher resolution.

As a result, when the display substrate is manufactured by using the method according to the foregoing embodiment, by providing the first barrier structure in the separation region 30, an effective encapsulation of the vicinity of the hole region 20 of the display substrate may be achieved after a thin film encapsulation process is performed, and the effectiveness and integrity of the thin film encapsulation is better ensured, such that the display substrate may met the demand for the development towards higher resolution while desirable encapsulation effect is ensured.

In some embodiments, the stopper pattern 310 includes a first stopper pattern 3101 and a second stopper pattern 3102; the inorganic layer structure includes a first inorganic layer 33, a second inorganic layer 34 and a third inorganic layer 35 sequentially stacked in the direction away from the base substrate 60, the first stopper pattern 3101 is located between the first inorganic layer 33 and the second inorganic layer 34, and the second stopper pattern 3102 is located between the second inorganic layer 34 and the third inorganic layer 35; the driver circuit layer includes a transistor structure 63 and a capacitor structure 64, the transistor structure 63 includes an active layer, a gate electrode and a source-drain electrode layer sequentially stacked in the direction away from the base substrate 60, the source-drain electrode layer includes a source electrode and a drain electrode arranged in a same layer and made of a same material, the capacitor structure 64 includes a first electrode plate 641 and a second electrode plate 642 arranged oppositely in a direction perpendicular to the base substrate 60, the first electrode plate 641 and the gate electrode are arranged in a same layer and made of a same material, the second electrode plate 642 is located between the first electrode plate 641 and the source-drain electrode layer; the first inorganic layer extends between the active layer and the gate electrode to act as a first gate insulation layer, the second inorganic layer 34 extends between the gate electrode and the second electrode plate 642 to act as a second gate insulation layer, and the third inorganic layer 35 extends between the second electrode plate 642 and the source-drain electrode layer to act as an interlayer dielectric layer;

a step of manufacturing the stopper pattern 310 specifically includes:

forming the first stopper pattern 3101 and the gate electrode simultaneously in a single patterning process;

forming the second stopper pattern 3102 and the second electrode plate 642 simultaneously in a single patterning process.

In the method according to the foregoing embodiment, the first stopper pattern 3101 and the gate electrode are formed simultaneously in a single patterning process, and the second stopper pattern 3102 and the second electrode plate 642 are formed simultaneously in a single patterning process, thereby facilitating a simplified manufacturing process flow of the display substrate and reducing the manufacturing costs of the display substrate.

In some embodiments, the method further includes:

manufacturing at least one second separation component 32 on the base substrate 60 in the separation region 30, wherein an orthographic projection of the second separation component 32 onto the base substrate 60 is located on a side of an orthographic projection of the first barrier structure 31 onto the base substrate 60, the side of the orthographic projection of the first barrier structure 31 onto the base substrate 60 being away from the hole region 20; a side surface of the second separation component 32 has a recess, and a portion of the light emission function layer 61 extending to the separation region 30 is disconnected on the side of the second separation component 32.

In the display substrate manufactured by using the method according to the foregoing embodiment, it is set that a side surface of the second separation component 32 has a recess, and a portion of the light emission function layer 61 extending to the separation region 30 can be disconnected at the recess in the side surface of the second separation component 32, thereby further avoiding the problem that moisture and oxygen penetrate from the cutting line at the hole boundary into the interior of the display screen via the light emission function layer 61 and erode the interior of the display screen, leading to a display failure.

In some embodiments, the pixel region 10 is further provided with a transistor structure 63 between the base substrate 60 and the light emission function layer 61, the transistor structure 63 includes an active layer, a gate electrode and a source-drain electrode layer sequentially stacked in the direction away from the base substrate 60, the source-drain electrode layer includes a source electrode and a drain electrode arranged in a same layer and made of a same material;

a step of manufacturing the first separation component 311 and the second separation component 32 specifically includes:

forming the first separation component 311, the second separation component 32, the source electrode and the drain electrode simultaneously in a single patterning process.

In the method according to the foregoing embodiment, the first separation component 311, the second separation component 32, the source electrode and the drain electrode are formed simultaneously in a single patterning process, thereby better simplifying the manufacturing process flow of the display substrate and reducing the manufacturing costs of the display substrate.

In some embodiments, the display substrate further includes a first source-drain metal layer and a second source-drain metal layer 66 sequentially stacked in the direction away from the base substrate 60 on the base substrate 60;

a step of manufacturing the first separation component 311 and the second separation component 32 specifically includes:

forming the first separation component 311, the second separation component 32 and the second source-drain metal layer 66 simultaneously in a single patterning process.

In the method according to the foregoing embodiment, the first separation component 311, the second separation component 32, the second source-drain metal layer 66 are formed simultaneously in a single patterning process, thereby better simplifying the manufacturing process flow of the display substrate and reducing the manufacturing costs of the display substrate.

It is noted, the embodiments provided in the specification are described in a progressive manner and the description of each embodiment focuses on its difference from other embodiments, thus the same or similar part among various embodiments may be referred to each other. In particular, for method embodiments, since they are essentially similar to the product embodiments, description of the method embodiments is relatively simple. For a relevant description, reference may be made to the description of the product embodiments.

It is understood by persons skilled in the art that, unless defined otherwise, all technical and scientific terms used herein have the same meaning as commonly understood by one of ordinary skill in the art to which this application belongs. Terms "first", "second" and the like in this disclosure are adopted not to describe a specific sequence, quantity or importance, but to distinguish different components. Term "include", "have" or any variant thereof refers to that an element or object preceding the term covers elements or objects and equivalents thereof listed behind the term, and does not preclude other elements or objects. The term "connection", "couple", "connected" or the like is not intended to be limited to a physical or mechanical connection. Rather, an electrical connection, whether direct or indirect, is encompassed. The terms "upper", "lower", "left", "right" and the like are merely used to denote a relative positional relationship. When the absolute position of a described object changes, the relative positional relationship may change accordingly.

It will be understood that when an element, such as a layer, a film, a region or a substrate, is referred to as being "above" or "below" another element, it can be "directly above" or "directly below" the other element or intervening elements may also be present.

In the description of the foregoing implementations, specific characteristics, structures, materials or features may be combined in appropriate manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display substrate, comprising a display region, wherein the display region comprises a pixel region, a hole region and a separation region located between the pixel region and the hole region and surrounding the hole region;
    the pixel region comprises a light emission function layer on a base substrate of the display substrate, and a driver circuit layer between the base substrate and the light emission function layer;
    the separation region is provided with at least one first barrier structure on the base substrate, wherein the first barrier structure comprises: a stopper pattern and a first separation component sequentially stacked in a direction away from the base substrate, a side surface of the first separation component has a recess, and a portion of the light emission function layer that extends to the separation region is disconnected on the side of the first separation component;
    wherein the driver circuit layer comprises a transistor structure and a capacitor structure, the transistor structure comprises an active layer, a gate electrode and a source-drain electrode layer sequentially stacked in the direction away from the base substrate, the source-drain electrode layer comprises a source electrode and a drain electrode arranged in a same layer and made of a same material, the capacitor structure comprises a first electrode plate and a second electrode plate arranged oppositely in a direction perpendicular to the base substrate, the first electrode plate and the gate electrode are arranged in a same layer and made of a same material, the second electrode plate is located between the first electrode plate and the source-drain electrode layer;
    wherein at least a part of the stopper pattern is arranged in a same layer and made of a same material as the gate electrode.

2. The display substrate according to claim 1, wherein the stopper pattern comprises a first stopper pattern and a second stopper pattern, the first stopper pattern is arranged in a same layer as the gate electrode.

3. The display substrate according to claim 1, wherein the separation region is further provided with an inorganic layer structure on the base substrate, wherein the inorganic layer structure comprises multiple stacked inorganic film layers, the stopper pattern is located between two adjacent inorganic film layers, and the first separation component is located on a side of the inorganic layer structure facing away from the base substrate.

4. The display substrate according to claim 3, wherein the inorganic layer structure comprises a first inorganic layer, a second inorganic layer and a third inorganic layer sequentially stacked in the direction away from the base substrate, the first stopper pattern is located between the first inorganic layer and the second inorganic layer, and the second stopper pattern is located between the second inorganic layer and the third inorganic layer.

5. The display substrate according to claim 4, wherein,
    the first inorganic layer extends between the active layer and the gate electrode to act as a first gate insulation layer, the second inorganic layer extends between the gate electrode and the second electrode plate to act as a second gate insulation layer, and the third inorganic layer extends between the second electrode plate and the source-drain electrode layer to act as an interlayer dielectric layer.

6. The display substrate according to claim 5, wherein the second stopper pattern and the second electrode plate are arranged in a same layer and made of a same material.

7. The display substrate according to claim 1, wherein,
the separation region is further provided with at least one second separation component on the base substrate, and an orthographic projection of the second separation component onto the base substrate is located on a side of an orthographic projection of the first barrier structure onto the base substrate which is away from the hole region;
a side surface of the second separation component has a recess, and a portion of the light emission function layer extending to the separation region is disconnected on the side of the second separation component.

8. The display substrate according to claim 4, wherein, the separation region is provided with multiple spaced-apart second separation components;
the inorganic layer structure extends between the multiple second separation components and the base substrate.

9. The display substrate according to claim 8, wherein, the inorganic layer structure has a groove, and an orthographic projection of the groove onto the base substrate is located between orthographic projections of the adjacent second separation components onto the base substrate.

10. The display substrate according to claim 9, wherein, the inorganic layer structure comprises a first gate insulation layer, a second gate insulation layer and an interlayer dielectric layer sequentially stacked in the direction away from the base substrate, and the groove passes through the first gate insulation layer, the second gate insulation layer and the interlayer dielectric layer in a direction perpendicular to the base substrate.

11. The display substrate according to claim 3, wherein the first separation component is arranged in a same layer as the source-drain electrode layer, and/or the second separation component is arranged in a same layer as the source-drain electrode layer.

12. The display substrate according to claim 11, wherein,
the first separation component comprises a first function pattern, a second function pattern and a third function pattern sequentially stacked in the direction away from the base substrate, an orthographic projection of the first function pattern onto the base substrate surrounds an orthographic projection of the second function pattern onto the base substrate, an orthographic projection of the third function pattern onto the base substrate surrounds the orthographic projection of the second function pattern onto the base substrate; and/or,
the second separation component comprises a fourth function pattern, a fifth function pattern and a sixth function pattern sequentially stacked in the direction away from the base substrate, an orthographic projection of the fourth function pattern onto the base substrate surrounds an orthographic projection of the fifth function pattern onto the base substrate, an orthographic projection of the sixth function pattern onto the base substrate surrounds the orthographic projection of the fifth function pattern onto the base substrate.

13. The display substrate according to claim 12, wherein, both the source electrode and the drain electrode comprise a first metal sub-film layer, a second metal sub-film layer and a third metal sub-film layer sequentially stacked in the direction away from the base substrate;
the first function pattern and the first metal sub-film layer are arranged in a same layer and made of a same material, the second function pattern and the second metal sub-film layer are arranged in a same layer and made of a same material, the third function pattern and the third metal sub-film layer are arranged in a same layer and made of a same material; and/or,
the fourth function pattern and the first metal sub-film layer are arranged in a same layer and made of a same material, the fifth function pattern and the second metal sub-film layer are arranged in a same layer and made of a same material, the sixth function pattern and the third metal sub-film layer are arranged in a same layer and made of a same material.

14. The display substrate according to claim 12, wherein, the display substrate further comprises a first source-drain metal layer and a second source-drain metal layer sequentially stacked on the base substrate in the direction away from the base substrate;
at least a part of the first separation component is arranged in a same layer as the first source-drain metal layer, and/or at least a part of the second separation component is arranged in a same layer as the first source-drain metal layer; or,
at least a part of the first separation component is arranged in a same layer as the second source-drain metal layer, and/or at least a part of the second separation component is arranged in a same layer as the second source-drain metal layer.

15. The display substrate according to claim 14, wherein, the second source-drain metal layer comprises a fourth metal sub-film layer, a fifth metal sub-film layer and a sixth metal sub-film layer sequentially stacked in the direction away from the base substrate;
the first function pattern and the fourth metal sub-film layer are arranged in a same layer and made of a same material, the second function pattern and the fifth metal sub-film layer are arranged in a same layer and made of a same material, the third function pattern and the sixth metal sub-film layer are arranged in a same layer and made of a same material; and/or,
the fourth function pattern and the fourth metal sub-film layer are arranged in a same layer and made of a same material, the fifth function pattern and the fifth metal sub-film layer are arranged in a same layer and made of a same material, the sixth function pattern and the sixth metal sub-film layer are arranged in a same layer and made of a same material.

16. The display substrate according to claim 7, wherein, the separation region is further provided with:
a dam structure on the base substrate, an orthographic projection of the dam structure onto the base substrate is located on a side of the orthographic projection of the first barrier structure onto the base substrate which is away from the hole region.

17. The display substrate according to claim 16, further comprising an encapsulation structure extending from the pixel region to the separation region, wherein the encapsulation structure comprises a first inorganic encapsulation layer, an organic encapsulation layer and a second inorganic encapsulation layer sequentially stacked in the direction away from the base substrate, wherein the first inorganic encapsulation layer and the second inorganic encapsulation layer completely cover the first barrier structure, the second separation component and the dam structure.

18. The display substrate according to claim 17, wherein, an orthographic projection of the organic encapsulation layer onto the base substrate is located on a side of the orthographic projection of the dam structure onto the base substrate which is away from the hole region.

19. A display device, comprising the display substrate according to claim 1.

20. A method for manufacturing a display substrate, the display substrate having a display region, the display region comprising a pixel region, a hole region and a separation region located between the pixel region and the hole region and surrounding the hole region, wherein the method comprises:

manufacturing a driver circuit layer on a base substrate in the pixel region, the driver circuit layer comprises a transistor structure and a capacitor structure, the transistor structure comprises an active layer, a gate electrode and a source-drain electrode layer sequentially stacked in the direction away from the base substrate, the source-drain electrode layer comprises a source electrode and a drain electrode arranged in a same layer and made of a same material, the capacitor structure comprises a first electrode plate and a second electrode plate arranged oppositely in a direction perpendicular to the base substrate, the first electrode plate and the gate electrode are arranged in a same layer and made of a same material, the second electrode plate is located between the first electrode plate and the source-drain electrode layer;

manufacturing at least one first barrier structure on the base substrate in the separation region; wherein the first barrier structure comprises: a stopper pattern and a first separation component sequentially stacked in a direction away from the base substrate, a side surface of the first separation component has a recess;

forming a light emission function layer in the pixel region and the separation region on the base substrate formed with the driver circuit layer, an inorganic layer structure and the at least one first barrier structure, wherein a portion of the light emission function layer in the separation region is disconnected on the side of the first separation component; wherein at least a part of the stopper pattern is arranged in a same layer as the gate electrode.

* * * * *